(12) United States Patent
Kumar et al.

(10) Patent No.: US 8,847,657 B2
(45) Date of Patent: Sep. 30, 2014

(54) LOW POWER RECEIVER FOR IMPLEMENTING A HIGH VOLTAGE INTERFACE IMPLEMENTED WITH LOW VOLTAGE DEVICES

(75) Inventors: Pankaj Kumar, Bangalore (IN); Pramod Parameswaran, Bangalore (IN); Vani Deshpande, Bangalore (IN); Makeshwar Kothandaraman, Bangalore (IN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 48 days.

(21) Appl. No.: 13/530,426

(22) Filed: Jun. 22, 2012

(65) Prior Publication Data

US 2013/0342258 A1 Dec. 26, 2013

(51) Int. Cl.
 *H03L 5/00* (2006.01)
(52) U.S. Cl.
 USPC .............................. 327/333; 326/80; 326/81
(58) Field of Classification Search
 USPC ...................................... 327/333; 326/80, 81
 See application file for complete search history.

(56) References Cited

U.S. PATENT DOCUMENTS

| | | | | |
|---|---|---|---|---|
| 5,270,589 A | * | 12/1993 | Sawada et al. | 326/68 |
| 5,455,794 A | * | 10/1995 | Javanifard et al. | 365/185.18 |
| 6,049,445 A | * | 4/2000 | Gauthier et al. | 361/56 |
| 6,064,231 A | * | 5/2000 | Kothandaraman et al. | 326/83 |
| 6,175,952 B1 | | 1/2001 | Patel et al. | 716/18 |
| 6,445,240 B1 | | 9/2002 | Taheri | 327/333 |
| 6,529,060 B2 | * | 3/2003 | Jung | 327/333 |
| 6,604,228 B1 | | 8/2003 | Patel et al. | 716/8 |
| 6,608,515 B2 | | 8/2003 | Taheri | 327/333 |
| 6,917,554 B2 | * | 7/2005 | Annavajjhala | 365/226 |
| 6,992,512 B1 | * | 1/2006 | D'Aquino et al. | 327/112 |
| 7,397,279 B2 | * | 7/2008 | Bhattacharya et al. | 326/80 |
| 7,821,327 B2 | * | 10/2010 | Parameswaran et al. | 327/536 |
| 7,855,574 B2 | * | 12/2010 | Santurkar et al. | 326/68 |
| 8,476,965 B2 | * | 7/2013 | Santo et al. | 327/538 |
| 2007/0019348 A1 | * | 1/2007 | Bhattacharya et al. | 361/91.1 |
| 2008/0211545 A1 | * | 9/2008 | Yen et al. | 327/94 |
| 2009/0309647 A1 | * | 12/2009 | Lim et al. | 327/437 |
| 2010/0026342 A1 | * | 2/2010 | Parameswaran et al. | 326/63 |
| 2010/0141334 A1 | * | 6/2010 | Kumar et al. | 327/543 |

* cited by examiner

*Primary Examiner* — Ryan Jager
(74) *Attorney, Agent, or Firm* — Christopher P. Maiorana, PC

(57) ABSTRACT

An apparatus comprising a first stage and a second stage. The first stage may be configured to generate an intermediate signal having a first voltage in response to an input signal having a second voltage received from a pad. The second stage may be configured to generate a core voltage in response to the first voltage. The voltage received from the pad may operate at a voltage compliant with one or more published interface specifications.

13 Claims, 7 Drawing Sheets

US 8,847,657 B2

LOW POWER RECEIVER FOR IMPLEMENTING A HIGH VOLTAGE INTERFACE IMPLEMENTED WITH LOW VOLTAGE DEVICES

FIELD OF THE INVENTION

The present invention relates to I/O devices generally and, more particularly, to a method and/or apparatus for implementing a low power receiver for a high voltage interface implemented with low voltage devices.

BACKGROUND OF THE INVENTION

Conventional circuits use thin gate oxide IO devices to operate reliably on a 1.8V supply. Conventional circuits sometimes implement a comparator-based architecture for a receiver used in high voltage interfaces implemented with low voltage devices. Since such a comparator consumes DC power, this solution has the drawback of having constant power consumption.

It would be desirable to implement a receiver architecture that operates reliably under normal operation where I/O devices operating at one voltage (e.g., in the range of 2.5V/3.3V) may be used to interface with core devices operating at a second voltage (e.g., in the range of 1.8V) to meet LVCMOS JEDEC specifications.

SUMMARY OF THE INVENTION

The present invention concerns an apparatus comprising a first stage and a second stage. The first stage may be configured to generate an intermediate signal having a first voltage in response to an input signal having a second voltage received from a pad. The second stage may be configured to generate a core voltage in response to the first voltage. The voltage received from the pad may operate at a voltage compliant with one or more published interface specifications.

The objects, features and advantages of the present invention include providing an I/O device that may (i) reduce DC power consumption, (ii) be implemented using 1.8 v I/O devices, (iii) interface with 2.5 v/3.5 v core supplies, (iv) meet LVCMOS JDEC Specifications, and/or (v) provide a high voltage interface to protect one or more circuits on an Integrated Circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
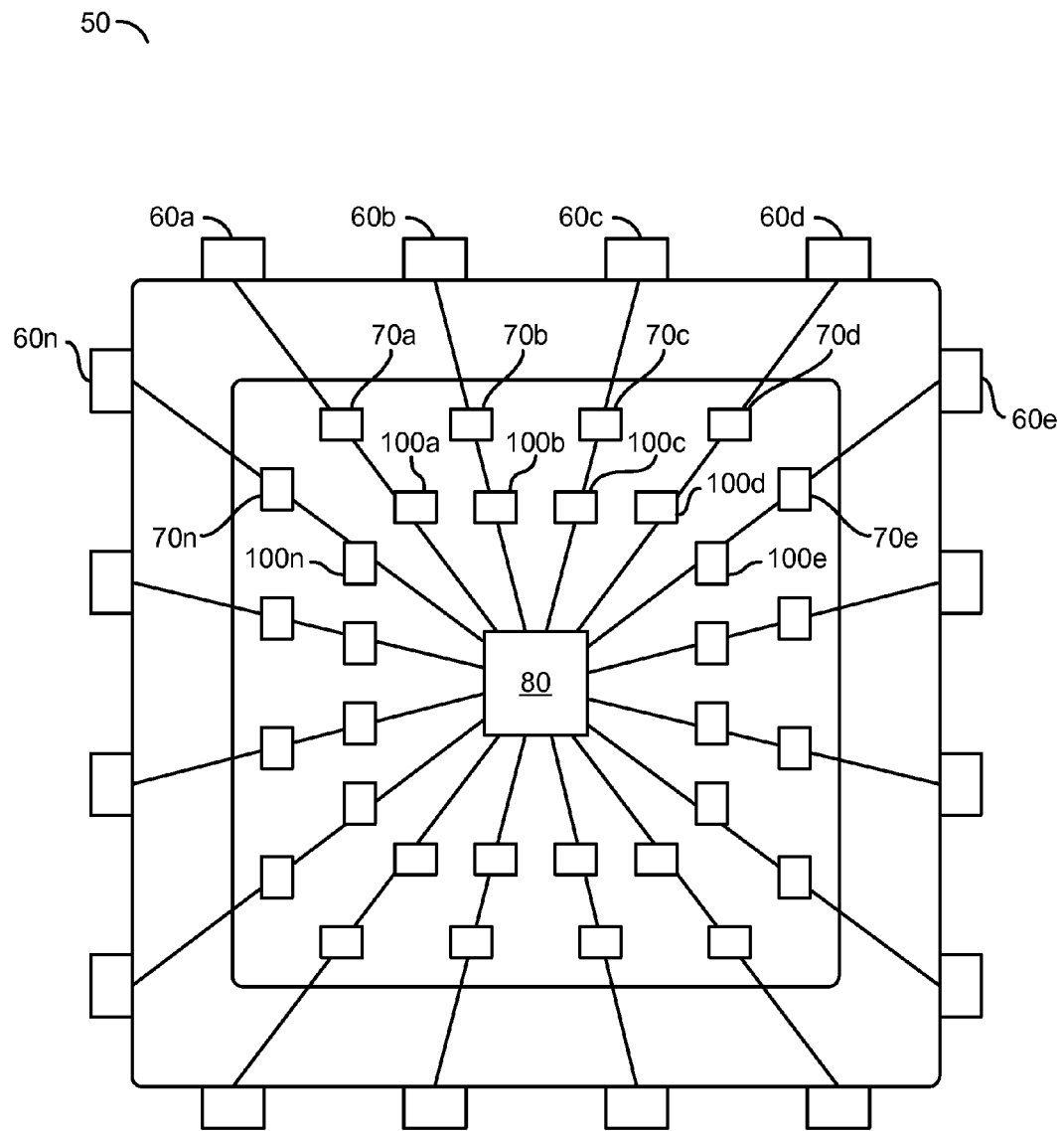
FIG. 1 is a diagram of a context of an embodiment of the invention.

Referring to FIG. 1, a block diagram of a circuit 50 is shown illustrating a context of an embodiment of the invention. The circuit 50 generally comprises a plurality of devices (or circuits) 60a-60n, a plurality of devices (or circuits) 70a-70n, a block (or circuit) 80, and a plurality of devices (or circuits) 100a-100n. In one example, the devices 60a-60n may be implemented as pins connected to a package of an integrated circuit (IC). The devices 70a-70n may be implemented as bond pads. The bond pads 70a-70n may be connected to the pins 60a-60n through a lead frame. The pads 70a-70n may be connected to the circuits 100a-100n through a plurality of bond wires. The circuit 80 may be implemented as a core circuit. The circuits 100a-100n may be implemented as a number of interface circuits. Each of the circuits 100a-100n may be configured to interface with supply voltages higher than the devices used to implement the circuits 100a-100n.

Figure 2:
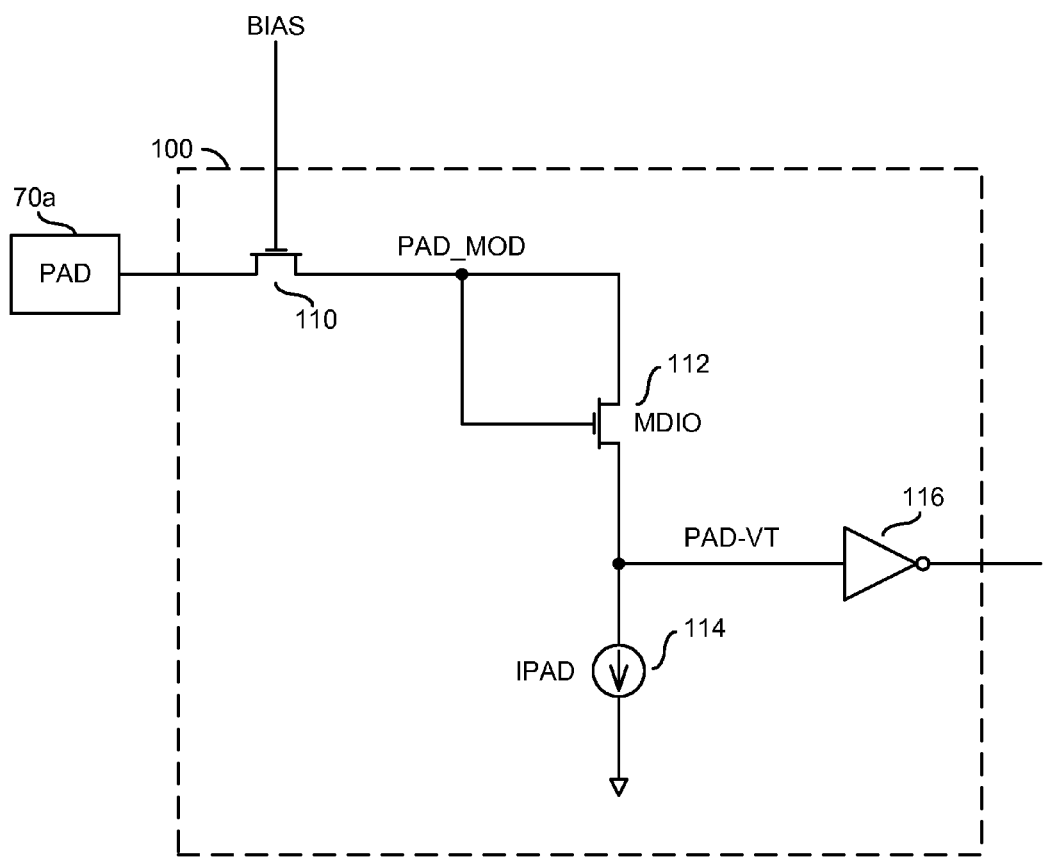
FIG. 2 is a diagram of a receiver in accordance with an embodiment of the invention.

Referring to FIG. 2, a diagram of a circuit 100 is shown illustrating an embodiment of the invention. The circuit 100 generally comprises a block (or circuit) 110, a block (or circuit) 112, a block (or circuit) 114 and a block (or circuit) 116. The device 110 may be implemented as a transistor. The device 110 may be implemented as a first stage. The device 110 may have a gate that may receive a signal (e.g., BIAS). The device 110 may present a signal (e.g., PAD_MOD) received from the pad 70a. The device 112 may be implemented as a second stage. The device 114 (e.g., IPAD) may be implemented as a current source. The device 116 may be implemented as an inverter. The first stage 116 is generally designed to trip at around 50% of an 10 supply voltage (e.g., VDDIO) in order to meet JEDEC Specifications. For example, the first stage 116 may be implemented as a 2.5V LVCMOS device that may trip at 1.25V. The inverter 116 may be implemented as a balanced inverter. In one example, the device 116 may be implemented as a 1.8V IO device that may be designed to trip at 0.9V. For the inverter to trip at 1.25V without the circuit 100, a skew of the ratio between PMOS to NMOS occurs, which degrades transient performance of inverter across PVT corners. The skewing without the circuit 100 also limits the frequency of operation. The circuit 100 may be configured to reduce and/or eliminate such skewing. The circuit 100 may be configured to increase transient performance.

Figure 3:
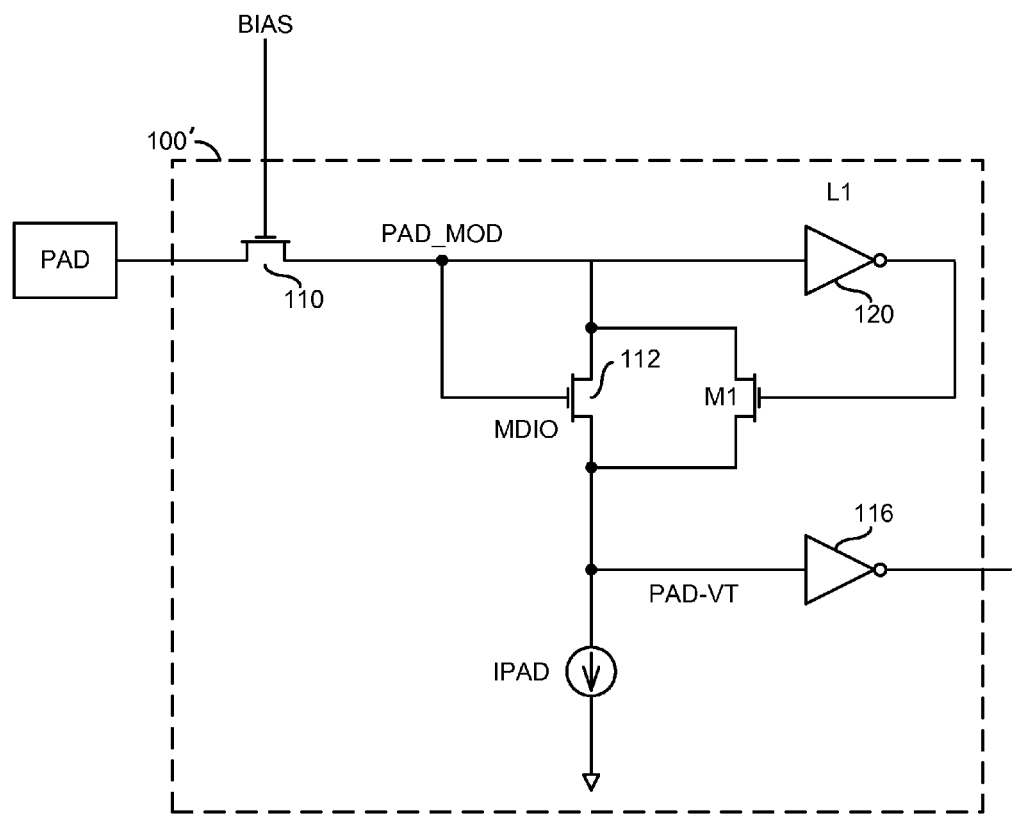
FIG. 3 is an alternate embodiment of a receiver.

Referring to FIG. 3, a diagram of a circuit 100' is shown. The circuit 100' illustrates an alternate implementation of the circuit 100. The circuit 100' is shown including a transistor M1, and a device 120. The transistor M1 may be connected between the source and drain of the transistor 112. The inverter 120 may present the voltage PAD_MOD to a gate of the transistor M1.

The circuit 100 (or 100') may provide an architecture to implement a receiver that may avoid skewing of the inverter 116. A signal from the PAD 70a may be passed through pass gate 110 as the signal PAD_MOD. The pass gate 110 may have a gate that may be connected to the signal BIAS. The signal BIAS may be implemented as a voltage that is generally designed to be less than 2 Volts across process, voltage and temperature (PVT) variations. 2 Volts may be the approximate reliability limit for a 1.8V IO device. While a 2 volt target for the signal BIAS is provided as an example, the particular voltage for the signal BIAS may be varied to meet the design criteria of a particular implementation.

The pass gate 110 may be implemented as a native device. The pass gate 110 may limit the voltage on the signal PAD_MOD to the value of the voltage of the signal BIAS. The devices in the stages following the circuit 100 may be protected from voltage stress (e.g., voltages that are larger than an operating voltage of the other devices). The signal PAD_MOD may be passed through a diode connected device 112. The device MDIO (112) may present a signal (e.g., PAD-VT)

that may operate at the voltage received from the PAD minus Vt, where Vt is a threshold drop from the device MDIO. The voltage threshold Vt may be adjusted by around 0.3 to 0.4V by adjusting the current source IPAD. The signal PAD-VT presented to the inverter 116 may be designed to lag by the voltage threshold Vt from the pad 70*a*.

Figure 4:
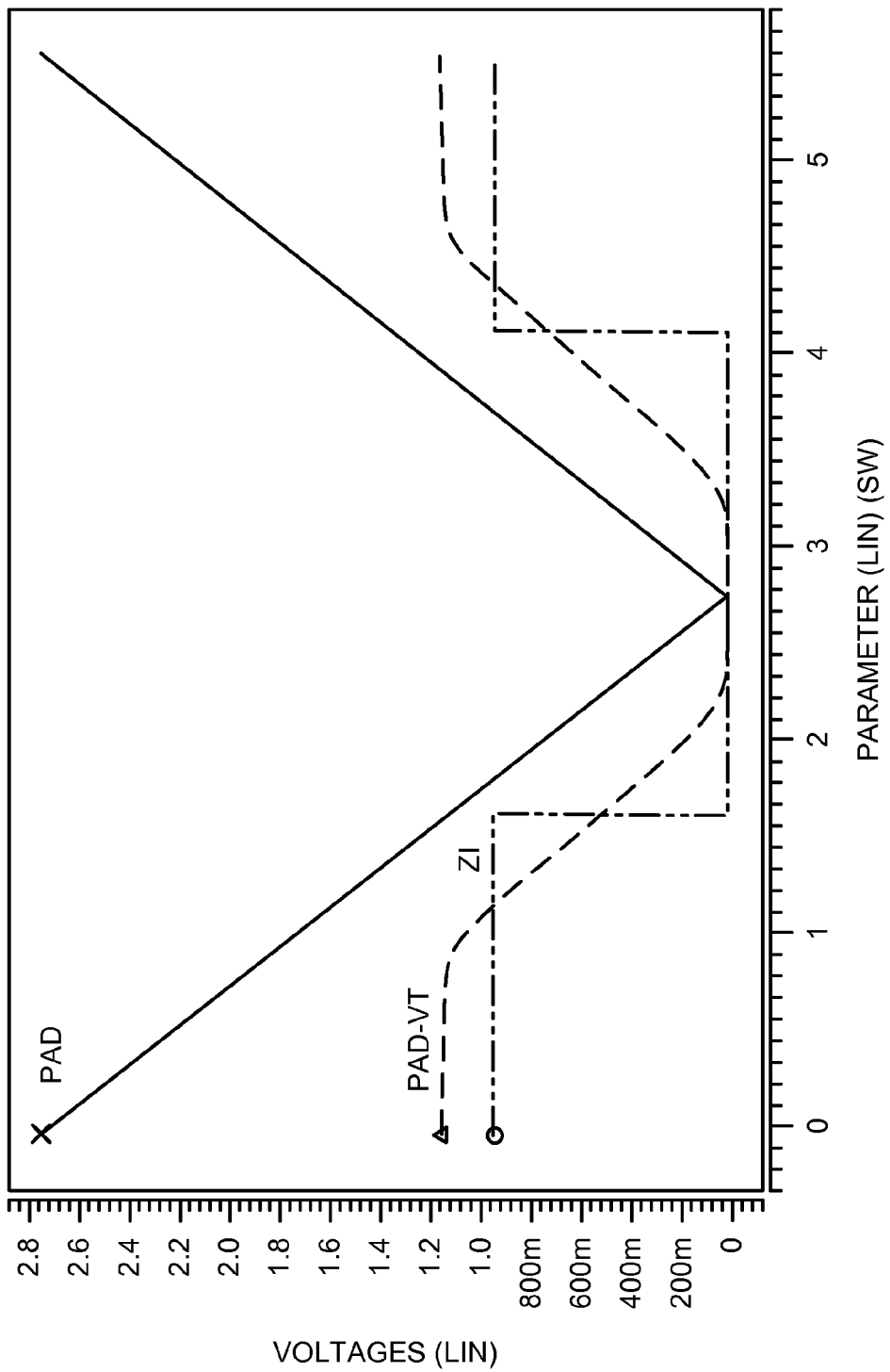
FIG. 4 is a plot of the circuit of FIG. 2.
Figure 5:
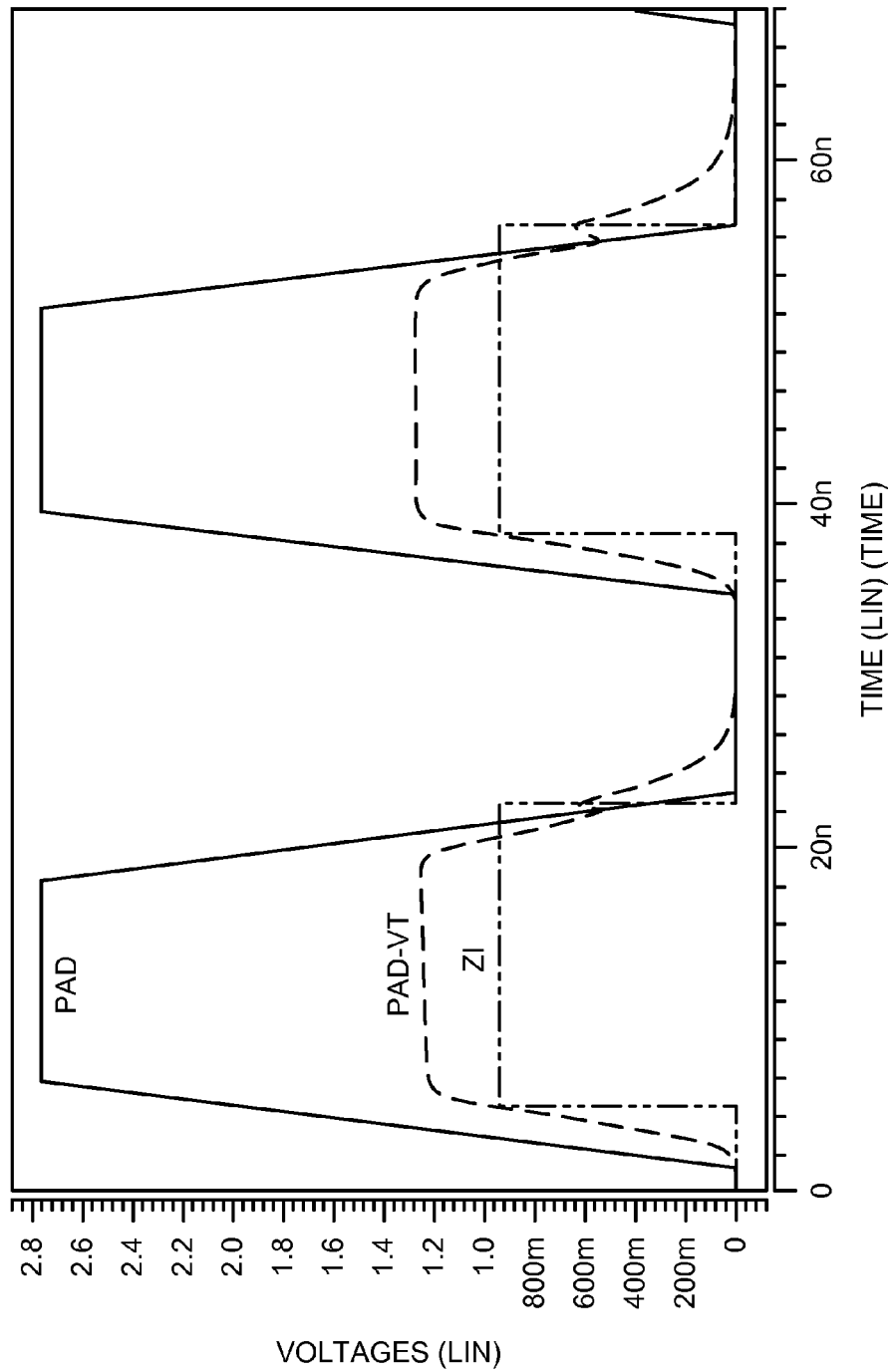
FIG. 5 is a transient plot of circuit of FIG. 1.

Referring to FIG. 4 and FIG. 5, DC and transient plots are shown of the circuit 100. Current consumption for the pad 70*a* (e.g., shown as PAD) is in the range of 40 uA during a nominal condition. The signal PAD-VT shows a drop from the voltage PAD. A shift of the switching threshold towards a JEDEC range for high voltage applications is normally implemented.

Figure 6:
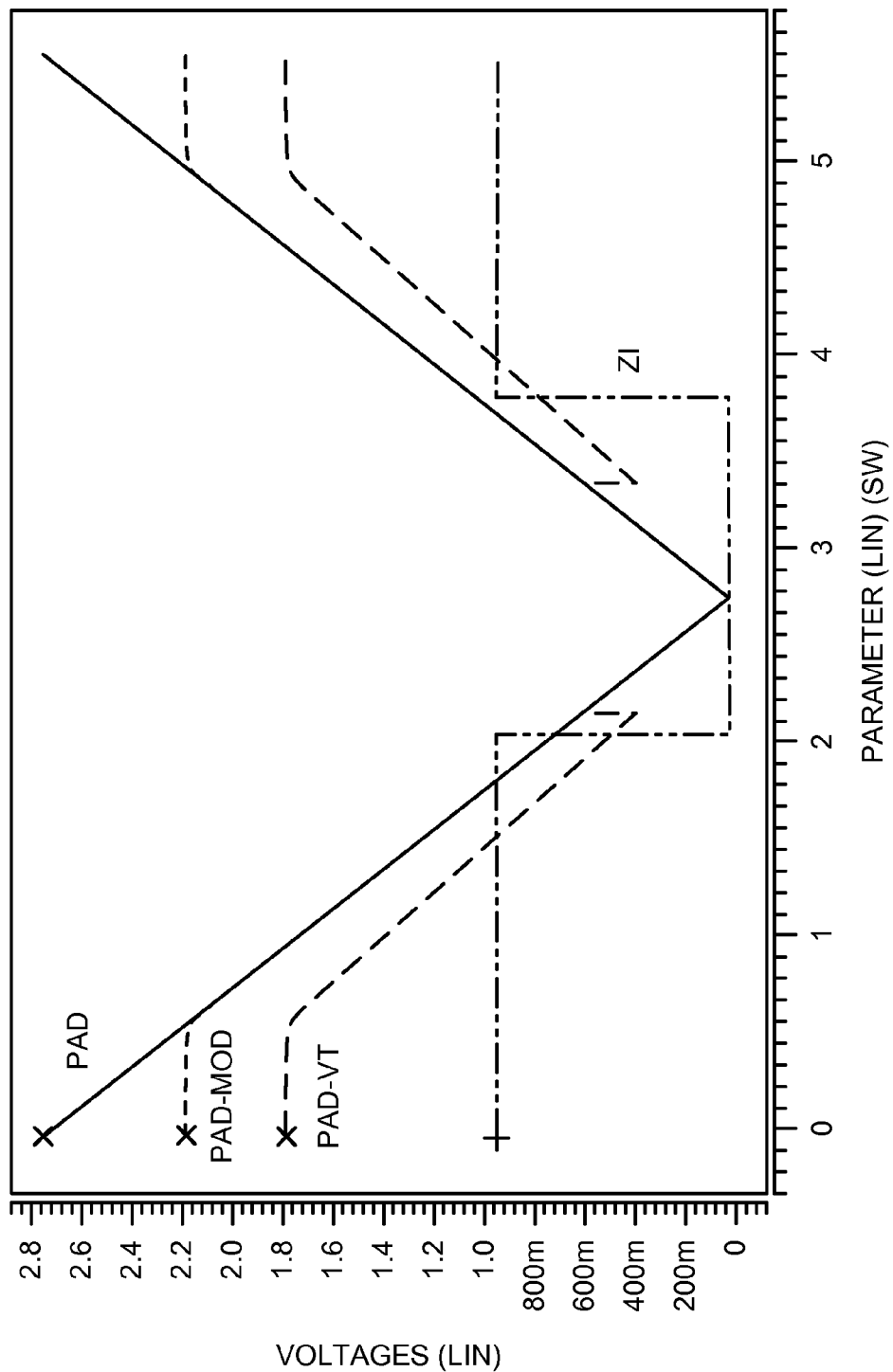
FIG. 6 is a DC plot of the circuit of FIG. 3.
Figure 7:
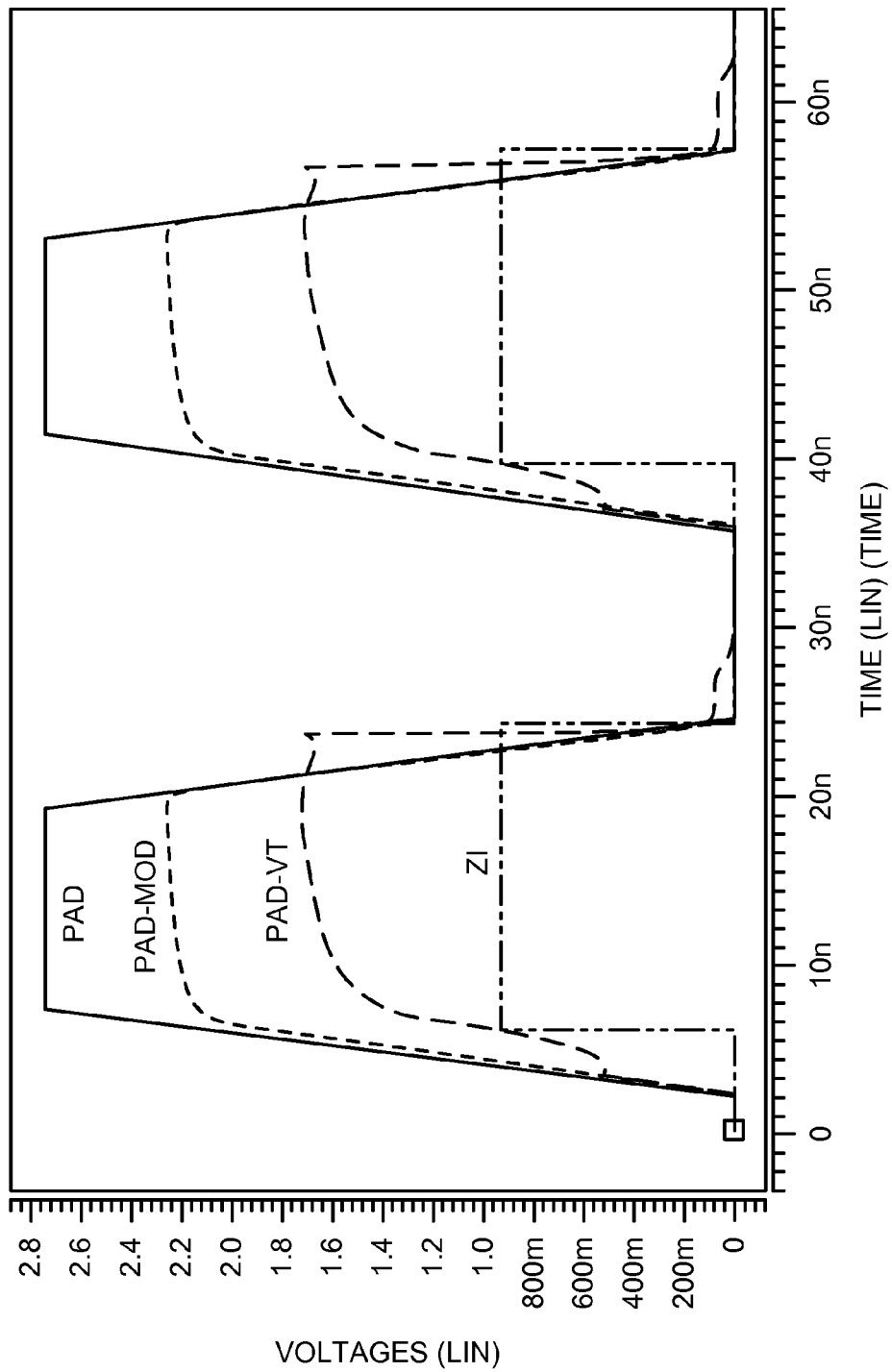
FIG. 7 is a transient plot of the circuit of FIG. 3.

Referring to FIG. 6 and FIG. 7, DC and transient plots are shown of the circuit 100. Current consumption of the signal PAD is shown in the range of 4 uA during a nominal condition. Similarly, the signal PAD-Vt shows a drop from the voltage PAD. A shift of the switching threshold towards a JEDEC range for high voltage applications is normally implemented.

The circuit 100 may be used to clamp a signal received from one of the pads 70*a*-70*n* to known voltage if the signal received is floating. The signals received from the pads 70*a*-70*n* may be processed to operate as a core level signal to meet JEDEC specifications. The circuit 100 may generate the signal PAD-Vt to help achieve a JEDEC compliant signal. The device 110 may be implemented as a native device. The device may be used to clamp the signal PAD_MOD to be the same as gate voltage (e.g., BIAS) even if input voltage (e.g., PAD) is higher than the gate voltage. The output of the native device 110 will normally be limited to voltage of the signal BIAS.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more integrated circuits, one or more chips or die arranged as flip-chip modules and/or multi-chip modules or by interconnecting an appropriate network of conventional component circuits, as is described herein, modifications of which will be readily apparent to those skilled in the art(s).

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first stage configured to generate an intermediate signal having a first voltage in response to an input signal having a second voltage received from a pad, wherein (A) said input signal is received at a source of a native device type transistor and (B) said first voltage is limited to a bias voltage received at a gate of said native transistor; and
   a second stage configured to generate a core voltage in response to said first voltage, wherein (i) said second stage comprises (a) a diode connected device configured to adjust a trip point of an output inverter to avoid the need to provide skewing, and (b) a current source configured to adjust a voltage threshold of said diode connected device, (ii) said second voltage received from said pad operates at a voltage compliant with one or more published interface specifications and (iii) said diode connected device has a gate and a source connected to said intermediate signal and a drain configured to generate said core voltage.

2. The apparatus according to claim 1, wherein one of said published specifications comprises a LVCMOS JDEC specification.

3. The apparatus according to claim 1, wherein said native device type transistor receives bias voltage that trips at around 50% of a supply voltage.

4. The apparatus according to claim 1, wherein said apparatus is connected between said pad and an integrated circuit core.

5. The apparatus according to claim 1, wherein said output inverter is connected to said core voltage.

6. A plurality of apparatus according to claim 1, each configured to connect between a respective pad and an integrated circuit core.

7. The apparatus according to claim 1, wherein said apparatus comprises one or more integrated circuits.

8. The apparatus according to claim 1, wherein said voltage received from said pad comprises a 2.5V signal and said core voltage operates at 1.8V.

9. The apparatus according to claim 1, wherein said voltage received from said pad comprises a 3.3V signal and said core voltage operates at 1.8V.

10. An apparatus comprising:
    means for generating an intermediate signal having a first voltage in response to an input signal having a second voltage received from a pad, wherein (A) said input signal is received at a source of a native device type transistor and (B) said first voltage is limited to a bias voltage received at a gate of said native transistor; and
    means for generating a core voltage in response to said first voltage, wherein (i) said means for generating said core voltage comprises (a) a diode connected device configured to adjust a trip point of an output inverter to avoid the need to provide skewing, and (b) a current source to adjust a voltage threshold of said diode connected device, (ii) said second voltage received from said pad operates at a voltage compliant with one or more published interface specifications and (iii) said diode connected device has a gate and a source connected to said intermediate signal and a drain configured to generate said core voltage.

11. A method for implementing a high voltage interface with low voltage devices, comprising the steps of:
    generating an intermediate signal having a first voltage in response to an input signal having a second voltage received from a pad, wherein (A) said input signal is received at a source of a native device type transistor and (B) said first voltage is limited to a bias voltage received at a gate of said native transistor; and generating a core voltage in response to said first voltage, wherein (i) said step of generating said core voltage comprises (a) a diode connected device configured to adjust a trip point of an output inverter to avoid the need to provide skewing, and (b) a current source to adjust a voltage threshold of said diode connected device, (ii) said second voltage received from said pad operates at a voltage compliant with one or more published interface specifications and (iii) said diode connected device has a gate and a source connected to said intermediate signal and a drain configured to generate said core voltage.

12. The method according to claim 11, wherein said voltage received from said pad comprises a 2.5V signal and said core voltage operates at 1.8V.

13. The method according to claim 11, wherein said voltage received from said pad comprises a 3.3V signal and said core voltage operates at 1.8V.

* * * * *